United States Patent
Zhou et al.

(10) Patent No.: US 12,284,766 B2
(45) Date of Patent: Apr. 22, 2025

(54) CERAMIC-CLADDED COPPER PLATE AND METHOD FOR MANUFACTURING CERAMIC-CLADDED COPPER PLATE

(71) Applicant: BYD COMPANY LIMITED, Guangdong (CN)

(72) Inventors: Wei Zhou, Shenzhen (CN); Qiang Xu, Shenzhen (CN); Caicai Xie, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 363 days.

(21) Appl. No.: 18/003,866

(22) PCT Filed: Jun. 28, 2021

(86) PCT No.: PCT/CN2021/102841
§ 371 (c)(1),
(2) Date: Dec. 29, 2022

(87) PCT Pub. No.: WO2022/001983
PCT Pub. Date: Jan. 6, 2022

(65) Prior Publication Data
US 2023/0269879 A1    Aug. 24, 2023

(30) Foreign Application Priority Data
Jun. 29, 2020  (CN) .......................... 202010605357.8

(51) Int. Cl.
| H05K 3/02 | (2006.01) |
|---|---|
| C04B 37/02 | (2006.01) |
| C23C 22/52 | (2006.01) |
| H05K 1/03 | (2006.01) |
| H05K 3/38 | (2006.01) |

(52) U.S. Cl.
CPC ........... H05K 3/022 (2013.01); C04B 37/023 (2013.01); H05K 1/0306 (2013.01); H05K 3/385 (2013.01); C04B 2237/122 (2013.01); C04B 2237/366 (2013.01); C04B 2237/368 (2013.01); C04B 2237/407 (2013.01); C04B 2237/525 (2013.01); C23C 22/52 (2013.01); H05K 2203/0786 (2013.01); H05K 2203/1105 (2013.01)

(58) Field of Classification Search
None
See application file for complete search history.

(56) References Cited

U.S. PATENT DOCUMENTS

| 4,328,048 | A | * | 5/1982 | Senda ....................... C23C 8/80 |
|---|---|---|---|---|
| | | | | 427/126.3 |
| 4,996,116 | A | * | 2/1991 | Webster ................ B32B 15/018 |
| | | | | 428/669 |
| 5,998,000 | A | | 12/1999 | Ikeda et al. |

FOREIGN PATENT DOCUMENTS

| CN | 101445386 | A | | 6/2009 | |
|---|---|---|---|---|---|
| CN | 101747073 | A | | 6/2010 | |
| CN | 103819215 | A | * | 5/2014 | ............. C04B 37/02 |
| CN | 107032817 | A | | 8/2017 | |
| CN | 108033810 | A | | 5/2018 | |
| CN | 108367994 | A | | 8/2018 | |
| CN | 108520855 | A | | 9/2018 | |
| CN | 109970462 | A | | 7/2019 | |
| CN | 110026633 | A | | 7/2019 | |
| CN | 110734295 | A | | 1/2020 | |
| CN | 110843272 | A | | 2/2020 | |
| CN | 110937912 | A | | 3/2020 | |
| EP | 3053899 | A1 | | 8/2016 | |
| JP | S 5635497 | A | | 4/1981 | |
| JP | S 5782181 | A | | 5/1982 | |
| JP | S 60177635 | A | | 9/1985 | |
| JP | 03114289 | A | | 5/1991 | |
| JP | 05213677 | A | | 8/1993 | |
| JP | 5614423 | B2 | | 10/2014 | |
| JP | 2019176152 | A | | 10/2019 | |
| TW | 200927481 | A | | 7/2009 | |
| WO | 2013015355 | A1 | | 1/2013 | |
| WO | 2019105814 | | | 6/2019 | |
| WO | 2020105734 | A1 | | 5/2020 | |
| WO | 2020105814 | A1 | | 5/2020 | |

OTHER PUBLICATIONS

Li—CN 103819215 A—MT—ceramic-copper laminate—2014 (Year: 2014).*
English Translation of International Search Report from PCT/CN2021/102841 dated Sep. 29, 2021.

* cited by examiner

*Primary Examiner* — John Vincent Lawler
(74) *Attorney, Agent, or Firm* — Calfee, Halter & Griswold LLP

(57) ABSTRACT

A method for preparing a ceramic copper clad laminate is provided, including following steps: providing a copper material; forming a copper oxide layer on a surface of the copper material; thermally treating the copper material on which the copper oxide layer is formed, to diffuse oxygen atoms in the copper material; removing the copper oxide layer on the thermally treated copper material; and soldering the copper-oxide-layer-removed copper material to a ceramic substrate to obtain a ceramic copper clad laminate.

18 Claims, No Drawings

CERAMIC-CLADDED COPPER PLATE AND METHOD FOR MANUFACTURING CERAMIC-CLADDED COPPER PLATE

CROSS-REFERENCE TO RELATED APPLICATIONS

This application is the National Stage of PCT International Application No. PCT/CN2021/102841, filed on Jun. 28, 2021, which claims priority to and benefit of Chinese Patent Application No. 202010605357.8 filed on Jun. 29, 2020 with the China National Intellectual Property Administration, which are incorporated herein by reference in its their entireties.

FIELD

The present disclosure relates to the technical field of ceramic copper clad laminates, and specifically to a ceramic copper clad laminate and a method for preparing the ceramic copper clad laminate.

BACKGROUND

In the field of power electronics, heat generated by a power module is mainly conducted through a ceramic copper clad laminate to the housing and dissipated to the outside. Therefore, the ceramic copper clad laminate is an indispensable key material for packaging of the power module. The ceramic copper clad laminate is a plate formed by metalizing the surface of a ceramic substrate by a special process. Aluminum oxide ceramic copper clad laminates with low thermal conductivity gradually cannot meet the packaging requirements, and cladding copper on a nitride ceramic substrate with high thermal conductivity such as an aluminum nitride ceramic substrate is more suitable for the manufacture of high-power electronic modules.

Different from alumina ceramic, nitride ceramic cannot be metalized by direct bonding copper (DBC), and are often bonded with a copper sheet by active metal brazing (AMB) process, a copper material is mainly soldered to nitride ceramic using an active metal solder to form a nitride ceramic copper clad laminate for packaging.

To avoid the oxidation of the active metal solder, the AMB process is generally carried out under a high vacuum condition of 750-1000° C. However, during this process, the secondary crystallization of the copper material leads to the rapid growth of copper grains. Excessively large copper grains affect the subsequent recognition of the circuit pattern (copper layer) on the ceramic copper-clad substrate by the charge-coupled device (CCD), which in turn affects automated packaging such as chip welding and wire bonding. Therefore, in the AMB process, it is very important to control the growth of the grains of the copper material.

SUMMARY

To solve the above technical problems, the present disclosure provides a method for preparing a ceramic copper clad laminate. The copper grains of the ceramic copper clad laminate obtained by the method is of a suitable size, providing a high CCD recognition rate.

A first aspect of the present disclosure provides a preparation method for a ceramic copper clad laminate, including following steps: providing a copper material; chemically oxidizing the copper material to form a copper oxide layer on a surface of the copper material; thermally treating the chemically oxidized copper material to diffuse oxygen atoms into the copper material; removing the copper oxide layer on the thermally treated copper material; and soldering the copper-oxide-layer-removed copper material to a ceramic substrate to obtain the ceramic copper clad laminate.

In the present disclosure, before the copper material and the ceramic substrate are soldered, the copper material is chemically oxidized to form a copper oxide layer on the surface of the copper material, and then the chemically oxidized copper material is thermally treated to diffuse oxygen atoms into the copper material. Afterward, the copper oxide layer is removed to obtain a copper material diffused with oxygen atoms, and then the copper material diffused with oxygen atoms is soldered with the ceramic substrate. The oxygen atoms in the copper material can hinder the growth of copper grains, so that the grain size of copper in the obtained ceramic copper clad laminate can be controlled, thereby obtaining the ceramic copper clad laminate with a high CCD recognition rate.

According to an aspect of the present disclosure, a method for preparing a ceramic copper clad laminate, including following steps: providing a copper material; forming a copper oxide layer on a surface of the copper material; thermally treating the copper material on which the copper oxide layer is formed, to diffuse oxygen atoms into the copper material; removing the copper oxide layer on the thermally treated copper material; and soldering the copper-oxide-layer-removed copper material to a ceramic substrate to obtain the ceramic copper clad laminate. In the present disclosure, before the copper material and the ceramic substrate are soldered, a copper oxide layer is formed on the surface of the copper material, and then the copper material on which the copper oxide layer is formed is thermally treated to diffuse oxygen atoms into the copper material. Afterward, the copper oxide layer is removed to obtain a copper material diffused with oxygen atoms, and then the copper material diffused with oxygen atoms is soldered with the ceramic substrate. The oxygen atoms in the copper material can hinder the growth of copper grains, so that the grain size of copper in the obtained ceramic copper clad laminate can be controlled, thereby obtaining a ceramic copper clad laminate with a high CCD recognition rate.

A second aspect of the present disclosure provides a ceramic copper clad laminate, which is prepared by the preparation method for a ceramic copper clad laminate. Therefore, the ceramic copper clad laminate has all the features and advantages of the preparation method for a ceramic copper clad laminate, and the details will not be repeated herein.

Still another aspect of the present disclosure provides a ceramic copper clad laminate, which is prepared by the method for preparing a ceramic copper clad laminate. Therefore, the ceramic copper clad laminate has all the features and advantages of the method for preparing a ceramic copper clad laminate, and the details will not be repeated herein.

A third aspect of the present disclosure provides a ceramic copper clad laminate, including a ceramic substrate, an active metal soldering layer, and a copper layer laminated in sequence, wherein, the copper layer contains oxygen element, and a mass of the oxygen element is 0.002-0.005% of the copper layer. The copper layer of the ceramic copper clad laminate contains the above content of oxygen, which can pin copper grains to increase the resistance to merging of interfaces between the copper grains and therefore provide a strong effect of inhibiting the secondary grain growth, thereby achieving an objective of controlling the grain size and providing the ceramic copper clad laminate with a high CCD recognition rate.

Still another aspect of the present disclosure provides a ceramic copper clad laminate, including a ceramic substrate, an active metal soldering layer, and a copper layer laminated in sequence, wherein, the copper layer contains oxygen element. The copper layer of the ceramic copper clad laminate contains the oxygen element, which can pin copper grains to increase the resistance to merging of interfaces between the copper grains and therefore provide a strong effect of inhibiting the secondary grain growth, thereby achieving an objective of controlling the grain size and providing the ceramic copper clad laminate with a high CCD recognition rate.

DETAILED DESCRIPTION

Embodiments of the present invention are described in detail as follows. Examples of the embodiments are shown in the accompanying drawing. In the accompanying drawings, the same or similar elements and elements having same or similar functions are denoted by same or similar reference numerals throughout the descriptions. The embodiments described below with reference to the accompanying drawings are exemplary and used only for explaining the present disclosure, and should not be construed as a limitation on the present disclosure.

This application is intended to resolve one of the technical problems in the related art to some extent.

In order to make the technical problem to be solved, technical solutions and beneficial effects of the present invention clearer, the present invention will be further described in detail in conjunction with the embodiments below. It is to be understood that the specific embodiments described herein are merely used for explaining this application but are not intended to limit this application.

A first aspect of the present disclosure provides a preparation method for a ceramic copper clad laminate, including following steps: providing a copper material; chemically oxidizing the copper material to form a copper oxide layer on a surface of the copper material; thermally treating the chemically oxidized copper material to diffuse oxygen atoms into the copper material; removing the copper oxide layer on the thermally treated copper material; and soldering the copper-oxide-layer-removed copper material to a ceramic substrate to obtain a ceramic copper clad laminate. In the present disclosure, before the copper material and the ceramic substrate are soldered, the copper material is chemically oxidized to form a copper oxide layer on the surface of the copper material, and then the chemically oxidized copper material is thermally treated to diffuse oxygen atoms into the copper material. Afterward, the copper oxide layer is removed to obtain a copper material diffused with oxygen atoms, and then the copper material diffused with oxygen atoms is soldered to the ceramic substrate. The oxygen atoms in the copper material can hinder the growth of copper grains, so that the grain size of copper in the obtained ceramic copper clad laminate can be controlled, thereby obtaining a ceramic copper clad laminate with a high CCD recognition rate.

According to an aspect of the present disclosure, a method for preparing a ceramic copper clad laminate, including following steps: providing a copper material; forming a copper oxide layer on a surface of the copper material; thermally treating the copper material on which the copper oxide layer is formed, to diffuse oxygen atoms into the copper material; removing the copper oxide layer on the thermally treated copper material; and soldering the copper-oxide-layer-removed copper material to a ceramic substrate to obtain a ceramic copper clad laminate. In the present disclosure, before the copper material and the ceramic substrate are soldered, a copper oxide layer is formed on the surface of the copper material, and then the copper material on which the copper oxide layer is formed is thermally treated to diffuse oxygen atoms into the copper material. Afterward, the copper oxide layer is removed to obtain a copper material diffused with oxygen atoms, and then the copper material diffused with oxygen atoms is soldered with the ceramic substrate. The oxygen atoms in the copper material can hinder the growth of copper grains, so that the grain size of copper in the obtained ceramic copper clad laminate can be controlled, thereby obtaining a ceramic copper clad laminate with a high CCD recognition rate.

In some embodiments of the present disclosure, before the copper material is chemically oxidized, the copper material is further cleaned to remove oil stains, the natural oxide layer, and the like on the surface of the copper material, to facilitate the attachment of the copper oxide layer during the chemically oxidizing and improve the controllability of the copper oxide layer.

Specifically, a reagent used in the cleaning includes, but is not limited to, at least one of sodium hydroxide, sulfuric acid, sodium citrate, acetone, or ethanol. Specifically, the copper material includes a raw material in the form of a copper sheet, a copper foil, etc. Specifically, the copper material is an oxygen-free copper material.

In some embodiments of the present disclosure, the forming the copper oxide layer includes chemically oxidizing the copper material. Specifically, the chemically oxidizing is carried out by at least one of following methods: (1) treating the copper material with a mixture solution of hypochlorite and a strong base; (2) treating the copper material with a mixture solution of a strong acid and hydrogen peroxide; or (3) treating the copper material with a persulfate solution.

In some embodiments of the present disclosure, the copper material is chemically oxidized, and the chemically oxidizing is carried out by at least one of following methods:
(1) oxidizing with an oxidizing solution containing 10-200 g/L of hypochlorite and 10-100 g/L of a strong base at 30-100° C. for 5-100 min;
(2) oxidizing with an oxidizing solution containing 10-200 g/L of a strong acid and 10-150 g/L of $H_2O_2$ at 30-80° C. for 5-40 min; or
(3) oxidizing with an oxidizing solution containing 30-150 g/L of persulfate at 30-80° C. and PH<4 for 5-40 min.

Therefore, the chemically oxidizing is simple and convenient to operate and easy to implement, and can efficiently form the copper oxide layer on the surface of the copper material.

When an oxidizing solution containing hypochlorite and a strong base is used, specifically, the concentration of hypochlorite is 50-120 g/L, the concentration of the strong base is 10-40 g/L, the oxidation temperature is 40-70° C., and the oxidation time is 10-30 min.

When an oxidizing solution containing a strong acid and $H_2O_2$ is used, specifically, the concentration of the strong acid is 30-130 g/L, the concentration of $H_2O_2$ is 20-120 g/L, the oxidation temperature is 40-70° C., and the oxidation time is 10-30 min.

When an oxidizing solution containing persulfate is used, specifically, the concentration of persulfate is 50-120 g/L, the oxidation temperature is 40-70° C., and the oxidation time is 10-30 min.

In some embodiments of the present disclosure, the hypochlorite may include sodium hypochlorite ($NaClO_2$) and/or potassium hypochlorite ($KClO_2$); the strong base may include potassium hydroxide (KOH) and/or sodium hydroxide (NaOH); the strong acid may include sulfuric acid ($H_2SO_4$); and the persulfate may include sodium persulfate and/or potassium persulfate.

In some embodiments of the present disclosure, the copper oxide layer has a thickness of 0.5-3 μm. This thickness can ensure that the subsequent thermal treatment can diffuse the oxygen in the copper oxide layer into the copper material, so that oxygen atoms exist at the interface (copper grain boundary) between the copper grains in the copper material. Specifically, the material of the copper oxide layer includes at least one of copper oxide or cuprous oxide.

In some embodiments of the present disclosure, the chemically oxidized copper material is thermally treated, a temperature of the thermal treatment is 400-900° C., and a time of the thermal treatment is 5-100 min. In some embodiments of the present disclosure, the temperature of the thermal oxidation may be 400, 450, 500, 550, 600, 700, 800, or 900° C., and the time of the thermal oxidation may be 5, 10, 20, 40, 60, 80, 90, or 100 min. Through the thermal treatment process, the oxygen in the copper oxide layer can be diffused into the copper grain boundaries of the copper material, to increase the resistance to merging of grain boundaries through the pinning effect of oxygen atoms on the copper grains and therefore provide a strong effect of inhibiting the secondary grain growth, thereby achieving an objective of controlling the grain size. Specifically, the temperature of the thermal treatment is 600-800° C., and the time of the thermal treatment is 5-30 min.

In some embodiments of the present disclosure, the thermal treatment is carried out under a vacuum or inert gas condition. Specifically, the thermal treatment may be carried out in any heating equipment capable of controlling the atmosphere content, e.g., a vacuum furnace, a box furnace, a tunnel furnace, a rotary atmosphere furnace, a bell furnace, a chain furnace, a tube furnace, a shuttle furnace, a pusher kiln, etc. The inert gas is at least one of nitrogen, helium, or argon.

In some embodiments of the present disclosure, after the copper material is thermally treated and before the copper material is soldered to the ceramic substrate, the copper oxide layer on the thermally treated copper material is removed, which can prevent the solder used for soldering from being oxidized to affect the soldering quality.

Specifically, the copper oxide layer may be removed by pickling or grinding (e.g., with abrasive paper or by chemical mechanical polishing (CMP)).

Specifically, the copper oxide layer is removed by pickling. When the copper oxide layer is removed by pickling, the thermally oxidized copper material may be contacted with an acid solution used for a period of time, and then taken out, washed and dried, so as to facilitate subsequent soldering. The removal of the copper oxide layer by pickling takes a short time (e.g., 2-10 s), with high removal efficiency, convenient operation, and a very small loss in the thickness of the copper material. Specifically, the acid used for the pickling includes at least one of sulfuric acid, hydrochloric acid, or phosphoric acid. Specifically, the concentration of the acid solution used in the pickling may be 10 wt % or less, for example, 1-10 wt %.

In some embodiments of the present disclosure, in the copper-oxide-layer-removed copper material, a mass of oxygen element is 0.001-0.01% of the copper material. Therefore, the copper material contains the above content of oxygen, which can increase the resistance to merging of grain boundaries through the pinning effect of oxygen atoms on the copper grains and therefore provide a strong effect of inhibiting the secondary grain growth, thereby achieving an objective of controlling the grain size. Specifically, in the copper-oxide-layer-removed copper material, the mass of oxygen element is 0.002-0.005% of the copper material.

In some embodiments of the present disclosure, the copper-oxide-layer-removed copper material is soldered to a ceramic substrate. Specifically, the soldering is active metal soldering. The active metal soldering is generally carried out in a high temperature and high vacuum environment, untreated copper will become coarser due to secondary crystallization during this process. In the preparation method for a ceramic copper clad laminate provided in the present disclosure, before the copper material is soldered, the copper material is chemically oxidized to form a copper oxide layer on the surface of the copper material, and then the chemically oxidized copper material is thermally treated to diffuse oxygen atoms into the copper material. Then, the copper oxide layer is removed before the copper material is soldered to the ceramic substrate, so as not to affect the soldering quality. During the soldering process, the pinning effect of oxygen atoms in the copper material increases the resistance to merging of grain boundaries and inhibits the secondary crystallization of copper grains, to control the grain size of the ceramic copper clad laminate to be within a suitable range, thereby improving the recognition rate of the copper material by a CCD and enhancing the bonding strength between the copper material and the ceramic substrate.

In some embodiments of the present disclosure, the soldering is active metal soldering, and the active metal soldering includes steps of: arranging an active metal solder on a surface of the ceramic substrate; covering the copper-oxide-layer-removed copper material on the active metal solder; and soldering in a vacuum environment to form a copper layer on the ceramic substrate to obtain the ceramic copper clad laminate. A method for arranging the active metal solder on the surface of the ceramic substrate includes: printing the active metal solder on the surface of the ceramic substrate.

In some embodiments of the present disclosure, the active metal soldering includes steps of: printing an active metal solder on a surface of the ceramic substrate; covering the copper-oxide-layer-removed copper material on the active metal solder; and soldering in a vacuum environment to form a copper layer on the ceramic substrate to obtain the ceramic copper clad laminate.

In some embodiments of the present disclosure, at least a grain size of copper on a side of the copper layer of the ceramic copper clad laminate away from the ceramic substrate is 10-200 μm. On the one hand, this can avoid the adverse effect of excessively large copper grains on CCD positioning, improve the automatic recognition rate without affecting the subsequent automated packaging processes such as chip welding and wire bonding, and prevent excessively large copper grains from affecting the bonding strength between the soldering layer and the copper material. On the other hand, this can also avoid the problems of low copper plasticity and insufficient thermal stress release in the ceramic copper clad laminate caused by excessively small copper grains.

In some embodiments of the present disclosure, after the soldering, a grain size of copper on a side of the copper material away from the ceramic substrate is 10-200 μm.

In some embodiments of the present disclosure, the ceramic substrate has a thickness of 0.2-2 mm. The ceramic substrate includes a nitride ceramic plate, an oxide ceramic plate, or a boride ceramic plate. Specifically, the ceramic substrate is nitride ceramic.

A second aspect of the present disclosure further provides a ceramic copper clad laminate, which is prepared by the preparation method for a ceramic copper clad laminate according to the first aspect of the present disclosure. Therefore, the ceramic copper clad laminate has all the features and advantages of the preparation method for a ceramic copper clad laminate, and the details will not be repeated herein.

Still another aspect of the present disclosure provides a ceramic copper clad laminate, which is prepared by the method for preparing a ceramic copper clad laminate. Therefore, the ceramic copper clad laminate has all the features and advantages of the method for preparing a ceramic copper clad laminate, and the details will not be repeated herein.

A third aspect of the present disclosure provides a ceramic copper clad laminate, including a ceramic substrate, an active metal soldering layer, and a copper layer laminated in sequence, wherein, the copper layer contains oxygen element, and a mass of the oxygen element is 0.002-0.005% of the copper layer. The copper layer of the ceramic copper clad laminate contains the above content of oxygen, which can pin copper grains to increase the resistance to merging of interfaces between the copper grains and therefore provide a strong effect of inhibiting the secondary grain growth, thereby achieving an objective of controlling the grain size and providing the ceramic copper clad laminate with a high CCD recognition rate.

Still another aspect of the present disclosure provides a ceramic copper clad laminate, including a ceramic substrate, an active metal soldering layer, and a copper layer laminated in sequence, wherein, the copper layer contains oxygen element. The copper layer of the ceramic copper clad laminate contains the oxygen element, which can pin copper grains to increase the resistance to merging of interfaces between the copper grains and therefore provide a strong effect of inhibiting the secondary grain growth, thereby achieving an objective of controlling the grain size and providing the ceramic copper clad laminate with a high CCD recognition rate.

In some embodiments of the present disclosure, a percentage by mass of the oxygen element in the copper layer is 0.002-0.005%. When the copper layer of the ceramic copper clad laminate contains the above content of oxygen, copper grains can be pinned to increase the resistance to merging of interfaces between the copper grains and therefore provide a strong effect of inhibiting the secondary grain growth, thereby achieving an objective of controlling the grain size and providing the ceramic copper clad laminate with a high CCD recognition rate.

In some embodiments of the present disclosure, at least a grain size of copper on a side of the copper layer away from the active metal soldering layer is 10-200 μm. On the one hand, this can avoid the adverse effect of excessively large copper grains on CCD positioning, improve the automatic recognition rate without affecting the subsequent automated packaging processes such as chip welding and wire bonding, and prevent excessively large copper grains from affecting the bonding strength between the soldering layer and the copper material. On the other hand, this can also avoid the problems of low copper plasticity and insufficient thermal stress release in the ceramic copper clad laminate caused by excessively small copper grains.

In some embodiments of the present disclosure, a grain size of copper on a side of the copper layer away from the active metal soldering layer is 10-200 μm.

In some embodiments of the present disclosure, the ceramic substrate includes a nitride ceramic plate, an oxide ceramic plate, or a boride ceramic plate. Specifically, the ceramic substrate is nitride ceramic.

The solutions of the present disclosure will be described below through specific examples. It should be noted that the following examples are only used to illustrate the present disclosure, and should not be construed as limiting the scope of the present disclosure. In the case that no specific technologies or conditions are indicated in the embodiments, the technologies or conditions described in the literatures in the art or the instructions for the product are followed. The reagents or instruments for which no manufacturers are noted are all common products commercially available from the market.

Example 1

A preparation method for a ceramic copper clad laminate included following steps.

(1) An oxygen-free copper sheet with a thickness of 0.5 mm was provided (where the copper content was 99.999%), and the surface of the copper sheet was washed. Specifically, the copper sheet was first washed using a dilute NaOH solution to remove oil stains on the surface, and then ultrasonically cleaned in ethanol and dried.

(2) The cleaned and dried copper sheet was placed in an oxidizing solution containing 60 g/L of $NaClO_2$ and 20 g/L of NaOH, and chemically oxidized at 50° C. for 20 min, to form a copper oxide layer with a thickness of 1 m on each of two opposing sides of the copper sheet.

(3) The chemically oxidized copper material was placed in a chain furnace into which nitrogen was introduced as a protective gas, and thermally treated at 700° C. for 10 min, to diffuse oxygen atoms into the copper material.

(4) The surface of the thermally treated copper sheet was pickled using sulfuric acid to remove the copper oxide layer, followed by washing with water and drying to obtain a copper sheet with an oxygen content of 0.002% by mass.

(5) Active metal soldering was carried out between the copper sheet obtained in the step (4) and a silicon nitride ceramic substrate with a thickness of 0.32 mm. Specifically, an active metal solder containing Ti was silk-screened on one surface of an aluminum nitride ceramic substrate, and the above copper sheet was covered on the active metal solder and soldered at 850° C. in a vacuum environment to obtain a ceramic copper clad laminate.

Example 2

A preparation method for a ceramic copper clad laminate included following steps.

(1) An oxygen-free copper sheet with a thickness of 0.5 mm was provided (where the copper content was 99.999%), and the surface of the copper sheet was washed. Specifically, the copper sheet was first washed using a dilute NaOH solution to remove oil stains on the surface, and then ultrasonically cleaned in ethanol and dried.

(2) The cleaned and dried copper sheet was placed in an oxidizing solution containing 60 g/L of $NaClO_2$ and 20 g/L of NaOH, and chemically oxidized at 70° C. for 30 min, to form a copper oxide layer with a thickness of 2 m on each of two opposing sides of the copper sheet.

(3) The chemically oxidized copper material was placed in a chain furnace into which nitrogen was introduced as a protective gas, and thermally treated at 700° C. for 10 min, to diffuse oxygen atoms into the copper material.

(4) The surface of the thermally treated copper sheet was pickled using sulfuric acid to remove the copper oxide layer, followed by washing with water and drying to obtain a copper sheet with an oxygen content of 0.003% by mass.

(5) Active metal soldering was carried out between the copper sheet obtained in the step (4) and a silicon nitride ceramic substrate with a thickness of 0.32 mm. Specifically, an active metal solder containing Ti was silk-screened on one surface of an aluminum nitride ceramic substrate, and the above copper sheet was covered on the active metal solder and soldered at 850° C. in a vacuum environment to obtain a ceramic copper clad laminate.

Example 3

(1) An oxygen-free copper sheet with a thickness of 0.5 mm was provided (where the copper content was 99.999%), and the surface of the copper sheet was washed. Specifically, the copper sheet was first washed using a dilute NaOH solution to remove oil stains on the surface, and then ultrasonically cleaned in ethanol and dried.

(2) The cleaned and dried copper sheet was placed in an oxidizing solution containing 80 g/L of $H_2SO_4$ and 100 g/L of $H_2O_2$, and chemically oxidized at 60° C. for 20 min, to form a copper oxide layer with a thickness of 1 m on each of two opposing sides of the copper sheet.

(3) The chemically oxidized copper material was placed in a chain furnace into which nitrogen was introduced as a protective gas, and thermally treated at 700° C. for 10 min, to diffuse oxygen atoms into the copper material.

(4) The surface of the thermally treated copper sheet was pickled using sulfuric acid to remove the copper oxide layer, followed by washing with water and drying to obtain a copper sheet with an oxygen content of 0.002% by mass.

(5) Active metal soldering was carried out between the copper sheet obtained in the step (4) and a silicon nitride ceramic substrate with a thickness of 0.32 mm. Specifically, an active metal solder containing Ti was silk-screened on one surface of an aluminum nitride ceramic substrate, and the above copper sheet was covered on the active metal solder and soldered at 850° C. in a vacuum environment to obtain a ceramic copper clad laminate.

Example 4

A preparation method for a ceramic copper clad laminate included following steps.

(1) An oxygen-free copper sheet with a thickness of 0.5 mm was provided (where the copper content was 99.999%), and the surface of the copper sheet was washed. Specifically, the copper sheet was first washed using a dilute NaOH solution to remove oil stains on the surface, and then ultrasonically cleaned in ethanol and dried.

(2) The cleaned and dried copper sheet was placed in an oxidizing solution containing 60 g/L of $NaClO_2$ and 20 g/L of NaOH, and chemically oxidized at 50° C. for 20 min, to form a copper oxide layer with a thickness of 1 m on each of two opposing sides of the copper sheet.

(3) The chemically oxidized copper material was placed in a chain furnace into which nitrogen was introduced as a protective gas, and thermally treated at 600° C. for 30 min, to diffuse oxygen atoms into the copper material.

(4) The surface of the thermally treated copper sheet was pickled using sulfuric acid to remove the copper oxide layer, followed by washing with water and drying to obtain a copper sheet with an oxygen content of 0.002% by mass.

(5) Active metal soldering was carried out between the copper sheet obtained in the step (4) and a silicon nitride ceramic substrate with a thickness of 0.32 mm. Specifically, an active metal solder containing Ti was silk-screened on one surface of an aluminum nitride ceramic substrate, and the above copper sheet was covered on the active metal solder and soldered at 850° C. in a vacuum environment to obtain a ceramic copper clad laminate.

Example 5

A preparation method for a ceramic copper clad laminate included following steps.

(1) An oxygen-free copper sheet with a thickness of 0.5 mm was provided (where the copper content was 99.999%), and the surface of the copper sheet was washed. Specifically, the copper sheet was first washed using a dilute NaOH solution to remove oil stains on the surface, and then ultrasonically cleaned in ethanol and dried.

(2) The cleaned and dried copper sheet was placed in an oxidizing solution containing 60 g/L of $NaClO_2$ and 20 g/L of NaOH, and chemically oxidized at 50° C. for 20 min, to form a copper oxide layer with a thickness of 1 m on each of two opposing sides of the copper sheet.

(3) The chemically oxidized copper material was placed in a chain furnace into which nitrogen was introduced as a protective gas, and thermally treated at 800° C. for 15 min, to diffuse oxygen atoms into the copper material.

(4) The surface of the thermally treated copper sheet was pickled using sulfuric acid to remove the copper oxide layer, followed by washing with water and drying to obtain a copper sheet with an oxygen content of 0.003% by mass.

(5) Active metal soldering was carried out between the copper sheet obtained in the step (4) and a silicon nitride ceramic substrate with a thickness of 0.32 mm. Specifically, an active metal solder containing Ti was silk-screened on one surface of an aluminum nitride ceramic substrate, and the above copper sheet was covered on the active metal solder and soldered at 850° C. in a vacuum environment to obtain a ceramic copper clad laminate.

Comparative Example 1

A preparation method for a ceramic copper clad laminate included following steps.

(1) An oxygen-free copper sheet with a thickness of 0.5 mm was provided (where the copper content was 99.999%), and the surface of the copper sheet was washed. Specifically, the copper sheet was first washed using a dilute NaOH solution to remove oil stains on the surface, and then ultrasonically cleaned in ethanol and dried.

(2) Active metal soldering was carried out between the copper sheet obtained in the step (1) and a silicon nitride ceramic substrate with a thickness of 0.32 mm. Specifically, an active metal solder containing Ti was silk-screened on one surface of an aluminum nitride ceramic substrate, and the above copper sheet was covered on the active metal solder and soldered at 850° C. in a vacuum environment to obtain a ceramic copper clad laminate.

Comparative Example 2

A preparation method for a ceramic copper clad laminate included following steps.

(1) An oxygen-free copper sheet with a thickness of 0.5 mm was provided (where the copper content was 99.999%), and the surface of the copper sheet was washed. Specifically, the copper sheet was first washed using a dilute NaOH solution to remove oil stains on the surface, and then ultrasonically cleaned in ethanol and dried.

(2) The cleaned and dried copper sheet was placed in an oxidizing solution containing 60 g/L of $NaClO_2$ and 20 g/L of NaOH, and chemically oxidized at 50° C. for 20 min, to form a copper oxide layer with a thickness of 1 m on each of two opposing sides of the copper sheet.

(3) The surface of the chemically treated copper sheet was pickled using sulfuric acid to remove the copper oxide layer, followed by washing with water and drying.

(4) Active metal soldering was carried out between the copper sheet obtained in the step (3) and a silicon nitride ceramic substrate with a thickness of 0.32 mm. Specifically, an active metal solder containing Ti was silk-screened on one surface of an aluminum nitride ceramic substrate, and the above copper sheet was covered on the active metal solder and soldered at 850° C. in a vacuum environment to obtain a ceramic copper clad laminate.

Performance Test

Grain size: The size of the copper grains in the copper layer of the ceramic copper clad laminate was observed by a crystallographic microscope. The specific method for calculating the grain size was the linear intercept method. Samples were taken from multiple positions on the copper surface, a straight line of a certain length was drawn on the copper surface, the number of grains that the straight line passed was counted. The length of the straight line was divided by the number of grains to obtain the grain size.

Test results: The performance of the ceramic copper clad laminates of Examples 1-5 and Comparative Examples 1-2 was tested respectively. Test results are shown in Table 1.

TABLE 1

|  | Grain size ($\mu m$) |
| --- | --- |
| Example 1 | 50 |
| Example 2 | 42 |
| Example 3 | 40 |
| Example 4 | 100 |
| Example 5 | 30 |
| Comparative Example 1 | 500 |
| Comparative Example 2 | 500 |

It can be seen from the test results in Table 1 that, compared with the ceramic copper clad laminates prepared in Comparative Examples 1-2, the copper grains of the ceramic copper clad laminates prepared in Examples 1-5 of the present disclosure are smaller, which is more conducive to CCD positioning, thereby improving the quality of subsequent automated packaging processes such as chip welding and wire bonding on the ceramic copper clad laminates.

The foregoing embodiments show only several implementations of this application and are described in detail, which, however, are not to be construed as a limitation to the patent scope of this application. For a person of ordinary skill in the art, several transformations and improvements can be made without departing from the idea of this application. These transformations and improvements belong to the protection scope of this application. Therefore, the protection scope of the patent of this application shall be subject to the appended claims.

In the description of this application, orientation or positional relationship indicated by terms "upper", "lower", or the like is based on orientation or positional relationship shown in the drawings, which is only for the convenience of describing this application rather than requiring that this application to be constructed and operated in a specific orientation, and not to be understood as restrictions on this application.

In the description of this specification, the description with reference to the terms "one embodiment", "another embodiment", and the like means that the specific feature, structure, material, or characteristic described in conjunction with the embodiment is included in at least one embodiment of this application. In the present specification, schematic representations of the above terms are not necessarily directed to the same embodiments or examples. Moreover, the specific features, structures, materials, or characteristics described may be combined in any one or more embodiments or examples in a suitable manner. In addition, different embodiments or examples described in the present specification, as well as features of different embodiments or examples, may be integrated and combined by those skilled in the art without contradicting each other.

What is claimed is:

1. A method for preparing a ceramic copper clad laminate, comprising following steps:
    forming a copper oxide layer on a surface of a copper material;
    thermally treating the copper material on which the copper oxide layer is formed, to diffuse oxygen atoms into the copper material;
    removing the copper oxide layer on the thermally treated copper material by pickling or grinding, and
    soldering the copper-oxide-layer-removed copper material to a ceramic substrate to obtain the ceramic copper clad laminate.

2. The method according to claim 1, wherein the forming the copper oxide layer comprises chemically oxidizing the copper material.

3. The method according to claim 2, wherein the chemically oxidizing is carried out by at least one of following methods:
    (1) treating the copper material with a mixture solution of hypochlorite and a strong base;
    (2) treating the copper material with a mixture solution of a strong acid and hydrogen peroxide; or
    (3) treating the copper material with an acidic persulfate solution.

4. The method according to claim 3, wherein the chemically oxidizing is carried out by at least one of following methods:
    (1) oxidizing with an oxidizing solution containing 10-200 g/L of hypochlorite and 10-100 g/L of a strong base at 30-100° C. for 5-100 min;
    (2) oxidizing with an oxidizing solution containing 10-200 g/L of a strong acid and 10-150 g/L of $H_2O_2$ at 30-80° C. for 5-40 min; or
    (3) oxidizing with an oxidizing solution containing 30-150 g/L of persulfate at 30-80° C. and PH<4 for 5-40 min.

5. The method according to claim 1, wherein the copper oxide layer has a thickness of 0.5-3 $\mu m$.

6. The method according to claim 1, wherein a temperature of the thermally treating is 400-900° C., and a time of the thermally treating is 5-100 min.

7. The method according to claim 1, wherein the thermally treating is carried out under a vacuum or inert gas condition.

8. The method according to claim 1, wherein in the copper-oxide-layer-removed copper material, a mass of oxygen element is 0.001-0.01% of a mass of the copper material.

9. The method according to claim 1, wherein the soldering is active metal soldering, and the active metal soldering comprises steps of:
arranging an active metal solder on a surface of the ceramic substrate;
covering the active metal solder with the copper-oxide-layer-removed copper material; and
soldering in a vacuum environment to form a copper layer on the ceramic substrate to obtain the ceramic copper clad laminate.

10. The method according to claim 1, wherein after the soldering, a grain size of copper on a side of the copper material away from the ceramic substrate is 10-200 μm.

11. The method according to claim 1, wherein the ceramic substrate comprises nitride ceramic.

12. The method according to claim 1, further comprising: cleaning the copper material before forming the copper oxide layer on the surface of the copper material.

13. The method according to claim 12, a reagent used in the cleaning comprises at least one of sodium hydroxide, sulfuric acid, sodium citrate, acetone, or ethanol.

14. A ceramic copper clad laminate, prepared by the method according to claim 1.

15. A ceramic copper clad laminate of claim 1, comprising a ceramic substrate, an active metal soldering layer, and a copper layer laminated in sequence, wherein, the copper layer contains oxygen element.

16. The ceramic copper clad laminate according to claim 15, wherein in the copper layer, a mass of the oxygen element is 0.002-0.005% of a mass of the copper layer.

17. The ceramic copper clad laminate according to claim 15, wherein a grain size of copper on a side of the copper layer away from the active metal soldering layer is 10-200 μm.

18. The ceramic copper clad laminate according to claim 15, wherein the ceramic substrate is nitride ceramic.

* * * * *